United States Patent
Ito (12)

(10) Patent No.: US 6,297,145 B1
(45) Date of Patent: Oct. 2, 2001

(54) METHOD OF FORMING A WIRING LAYER HAVING AN AIR BRIDGE CONSTRUCTION

(75) Inventor: Shinya Ito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/311,151

(22) Filed: May 13, 1999

(30) Foreign Application Priority Data

May 15, 1998 (JP) .................................................. 10-133367

(51) Int. Cl.[7] .......................... H01L 21/76; H01L 21/4763
(52) U.S. Cl. .......................... 438/619; 438/421; 438/422; 438/319; 438/411
(58) Field of Search .................................... 438/619, 421, 438/422, 319, 411; 257/522

(56) References Cited

U.S. PATENT DOCUMENTS

| | | | |
|---|---|---|---|
| 5,958,800 | * | 9/1999 | Yu et al. ............................... 438/720 |
| 5,960,313 | * | 9/1999 | Jun ...................................... 438/624 |

FOREIGN PATENT DOCUMENTS

| | | |
|---|---|---|
| 1-264243 | 10/1989 | (JP) . |
| 2-128449 | 5/1990 | (JP) . |
| 2-184049 | 7/1990 | (JP) . |
| 4-42562 | 2/1992 | (JP) . |
| 4-122051 | 4/1992 | (JP) . |
| 6-310612 | 11/1994 | (JP) . |
| 2705556 | 10/1997 | (JP) . |

* cited by examiner

*Primary Examiner*—Jey Tsai
*Assistant Examiner*—Ha Tran Nguyen
(74) *Attorney, Agent, or Firm*—Young & Thompson

(57) ABSTRACT

A method of manufacturing a semiconductor device having a wiring layer with an air bridge construction includes the steps of forming a lower layer metal interconnect, depositing an interlayer insulation film, depositing a first and a second insulation film, patterning the second insulation film and of etching the first insulation film and the interlayer insulation film using the second insulation film as a mask so as to form a post opening part and a via hole to connect an upper layer metal interconnect with the lower layer metal interconnect, depositing a third insulation film over the entire surface, etching back so as to leave the third insulation film in a side wall of the post opening part and fill the via hole with the third insulation film, depositing a fourth insulation film over the entire surface of the structure, then removing the fourth insulation film until the via hole is exposed, and then removing the third insulation film inside the via hole, filling the via hole with a metal, and then flattening the entire surface of the structure, forming a metal film over the entire surface of the flattened structure and further forming a fifth insulation film thereon, which is then patterned, removing the metal film using the patterned fifth insulation film as a mask so as to form the upper layer metal interconnect, and etching the interlayer insulation film so as to form an air bridge interconnect.

3 Claims, 19 Drawing Sheets

1 : SILICON SUBSTRATE          2 : LOWER METAL INTERCONNECT
3 : FIRST INTERLAYER INSULATION FILM
1 6 : FIRST VIA HOLE
1 8 : THIRD SILICON OXIDE FILM
2 0 : SECOND METAL INTERCONNECT
2 1 : SECOND INTERLAYER INSULATION FILM
3 2 : SECOND VIA HOLE
3 3 : THIRD METAL INTERCONNECT
3 4 : FIFTH SILICON OXIDE FILM
3 5, 3 6 : INSULATION POST (a)

(b)

(c)

1 : SILICON SUBSTRATE
2 : LOWER METAL INTERCONNECT
3 : FIRST INTERLAYER INSULATION FILM
4 : FIRST SILICON NITRIDE FILM
5 : FIRST SILICON OXIDE FILM
6 : FIRST RESIST FILM
7 : POST PART
8 : VIA HOLE (a)

(b)

(c)

1 : SILICON SUBSTRATE
2 : LOWER METAL INTERCONNECT
3 : FIRST INTERLAYER INSULATION FILM
4 : FIRST SILICON NITRIDE FILM
5 : FIRST SILICON OXIDE FILM
9 : SUPPORT OPENING PART
1 0 : VIA HOLE
1 2 : SECOND SILICON OXIDE FILM

1 : SILICON SUBSTRATE
2 : LOWER METAL INTERCONNECT
3 : FIRST INTERLAYER INSULATION FILM
1 2 : SECOND SILICON OXIDE FILM
1 4 : SECOND SILICON NITRIDE FILM
1 5 : SILICON NITRIDE FILM
3 5 : INSULATION POST

1 : SILICON SUBSTRATE
2 : LOWER METAL INTERCONNECT
3 : FIRST INTERLAYER INSULATION FILM
1 2 : SECOND SILICON OXIDE FILM
1 5 : SILICON NITRIDE FILM
1 6 : FIRST VIA HOLE
1 7 : SECOND METAL FILM
1 8 : THIRD SILICON OXIDE FILM
3 5 : INSULATION POST

1 : SILICON SUBSTRATE
2 : LOWER METAL INTERCONNECT
3 : FIRST INTERLAYER INSULATION FILM
1 2 : SECOND SILICON OXIDE FILM
1 5 : SILICON NITRIDE FILM
1 6 : FIRST VIA HOLE
1 7 : SECOND METAL FILM
1 8 : THIRD SILICON OXIDE FILM
1 9 : SECOND RESIST FILM
2 0 : SECOND METAL INTERCONNECT
3 5 : INSULATION POST

16: FIRST VIA HOLE
17: SECOND METAL FILM
18: THIRD SILICON OXIDE FILM
19: SECOND RESIST FILM
20: SECOND METAL INTERCONNECT
21: SECOND INTERLAYER INSULATION FILM
22: THIRD SILICON NITRIDE FILM
23: FOURTH SILICON OXIDE FILM
35: INSULATION POST

18 : THIRD SILICON OXIDE FILM
20 : SECOND METAL INTERCONNECT
21 : SECOND INTERLAYER INSULATION FILM
22 : THIRD SILICON NITRIDE FILM
23 : FOURTH SILICON OXIDE FILM
24 : THIRD RESIST FILM
35 : INSULATION POST (a)

(b)

1 : SILICON SUBSTRATE
2 : LOWER METAL INTERCONNECT
3 : FIRST INTERLAYER INSULATION FILM
1 2 : SECOND SILICON OXIDE FILM
1 5 : SILICON NITRIDE FILM
1 6 : FIRST VIA HOLE
1 8 : THIRD SILICON OXIDE FILM
2 0 : SECOND METAL INTERCONNECT
2 1 : SECOND INTERLAYER INSULATION FILM
3 5, 3 6 : INSULATION POST (a)

(b)

1 : SILICON SUBSTRATE
2 : LOWER METAL INTERCONNECT
3 : FIRST INTERLAYER INSULATION FILM
1 2 : SECOND SILICON OXIDE FILM
1 5 : SILICON NITRIDE FILM
1 6 : FIRST VIA HOLE
1 8 : THIRD SILICON OXIDE FILM
2 0 : SECOND METAL INTERCONNECT
2 1 : SECOND INTERLAYER INSULATION FILM
3 2 : SECOND VIA HOLE
3 5, 3 6 : INSULATION POST (a)

(b)

1 : SILICON SUBSTRATE
2 : LOWER METAL INTERCONNECT
3 : FIRST INTERLAYER INSULATION FILM
1 6 : FIRST VIA HOLE
1 8 : THIRD SILICON OXIDE FILM
2 0 : SECOND METAL INTERCONNECT
2 1 : SECOND INTERLAYER INSULATION FILM
3 2 : SECOND VIA HOLE
3 3 : THIRD METAL INTERCONNECT
3 4 : FIFTH SILICON OXIDE FILM
3 5, 3 6 : INSULATION POST (a)

(b)

2 : LOWER METAL INTERCONNECT
1 6 : FIRST VIA HOLE
2 0 : SECOND METAL INTERCONNECT
3 2 : SECOND VIA HOLE
3 3 : THIRD METAL INTERCONNECT
3 5, 3 6 : INSULATION POST

1 : SILICON SUBSTRATE

2 : LOWER METAL INTERCONNECT

3 : FIRST INTERLAYER INSULATION FILM

4 : FIRST SILICON NITRIDE FILM

9 : SUPPORT OPENING PART

10 : VIA HOLE

12 : SECOND SILICON OXIDE FILM

PRIOR ART Fig. 13
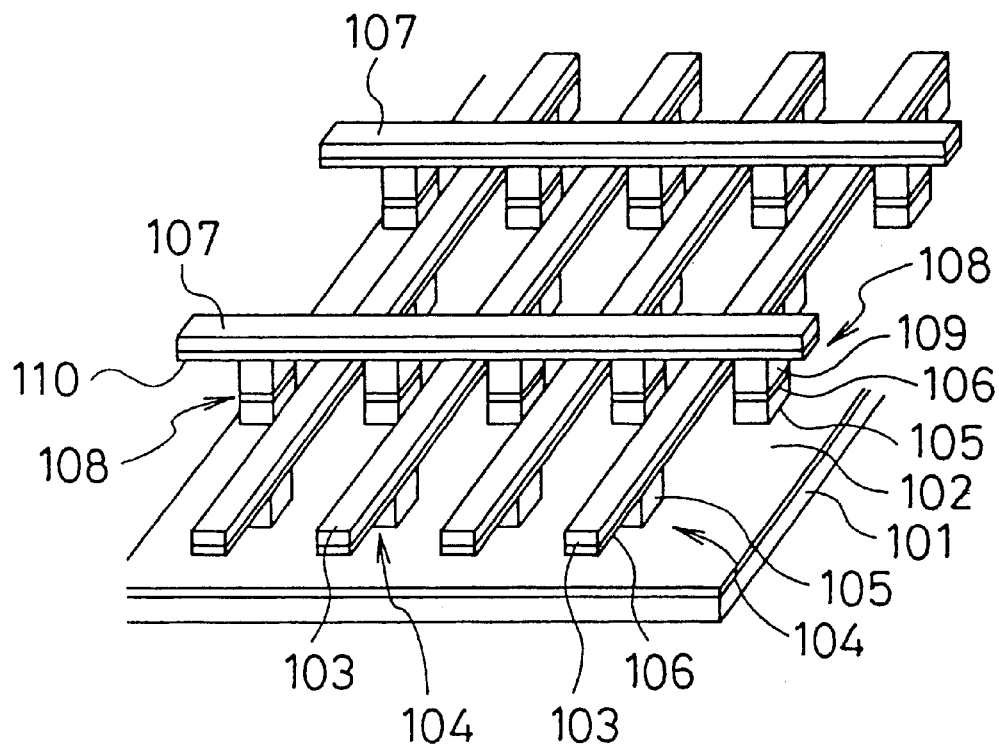
101: SILICON SUBSTRATE
102: SILICON NITRIDE FILM
103: FIRST ALUMINUM INTERCONNECT
104: FIRST POST-SHAPED INSULATION FILM
105: POST-SHAPED CVD OXIDE FILM
106: SILICON NITRIDE FILM
107: SECOND ALUMINUM OXIDE FILM
108: SECOND POST-SHAPED INSULATION FILM
109: SECOND POST-SHAPED CVD OXIDE FILM PRIOR ART Fig. 14
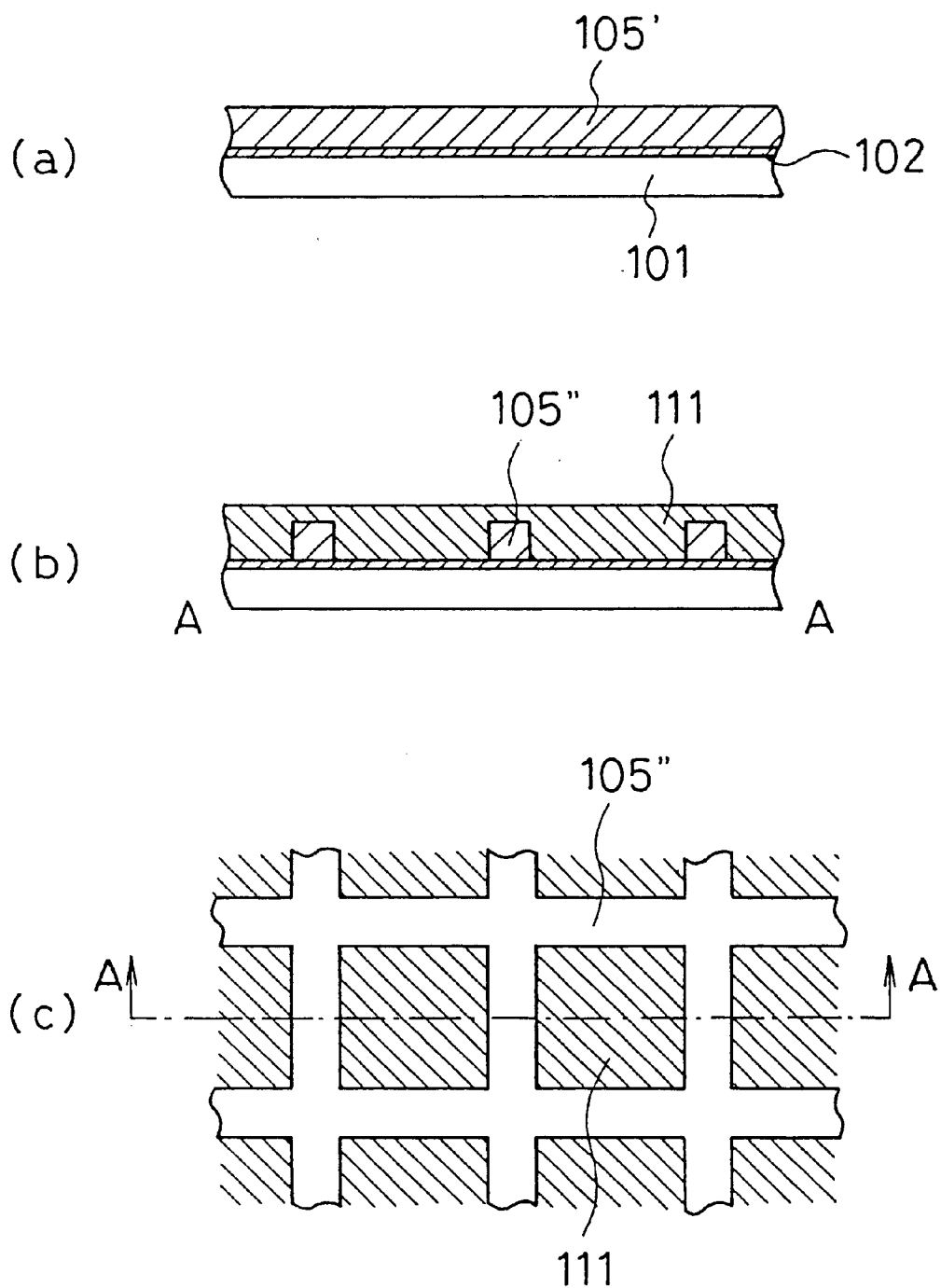

PRIOR ART Fig. 15
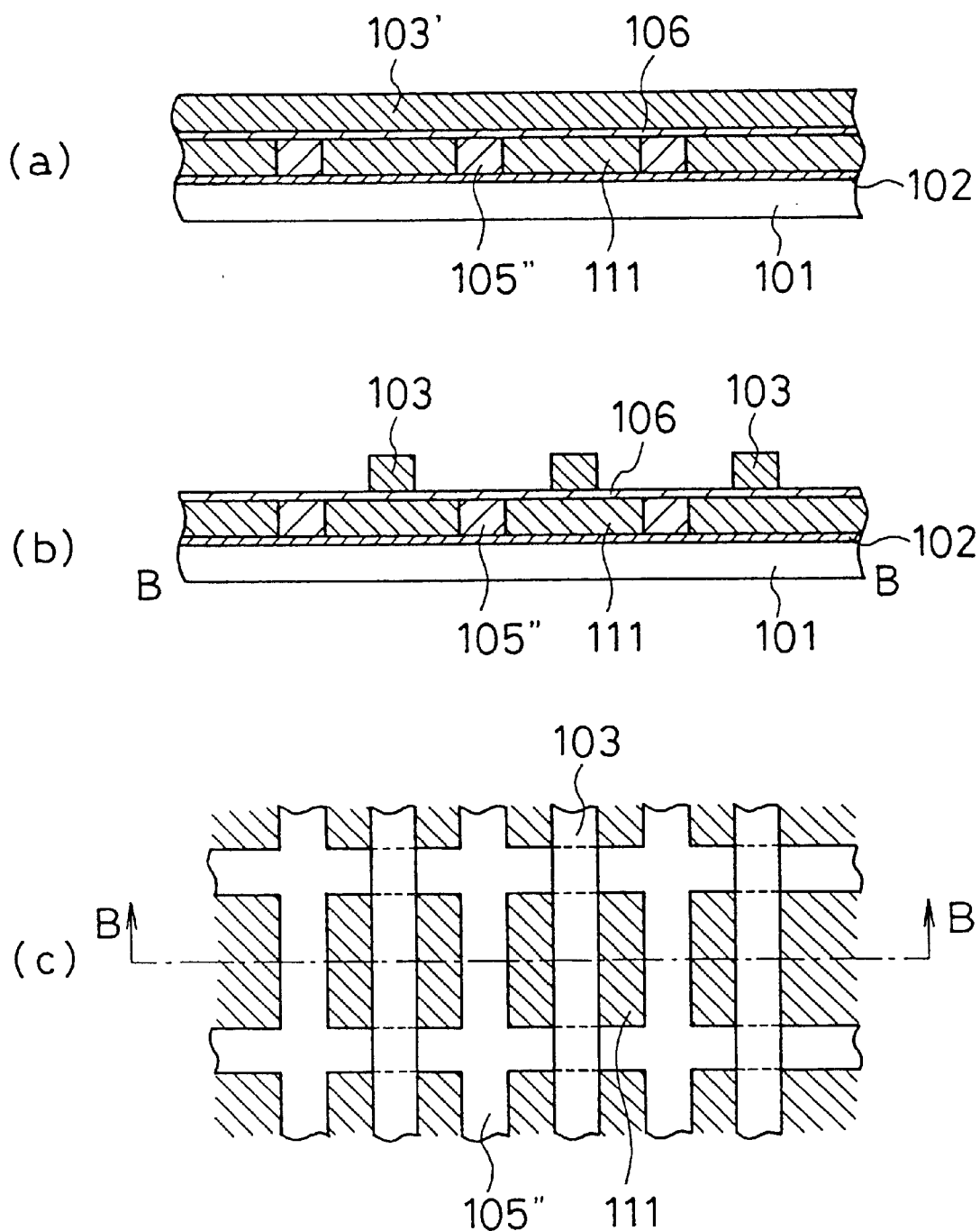

PRIOR ART Fig. 16
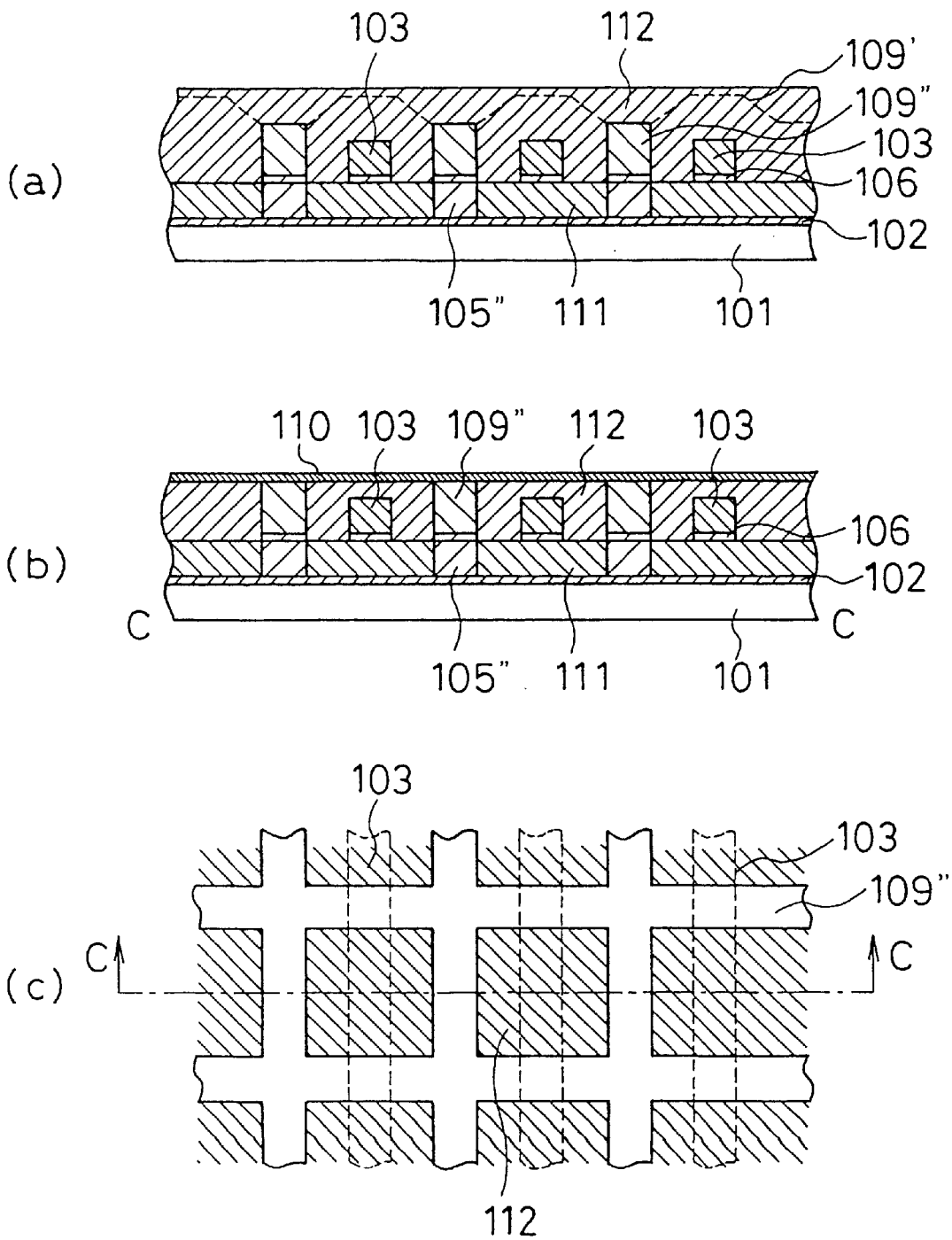

PRIOR ART Fig. 17
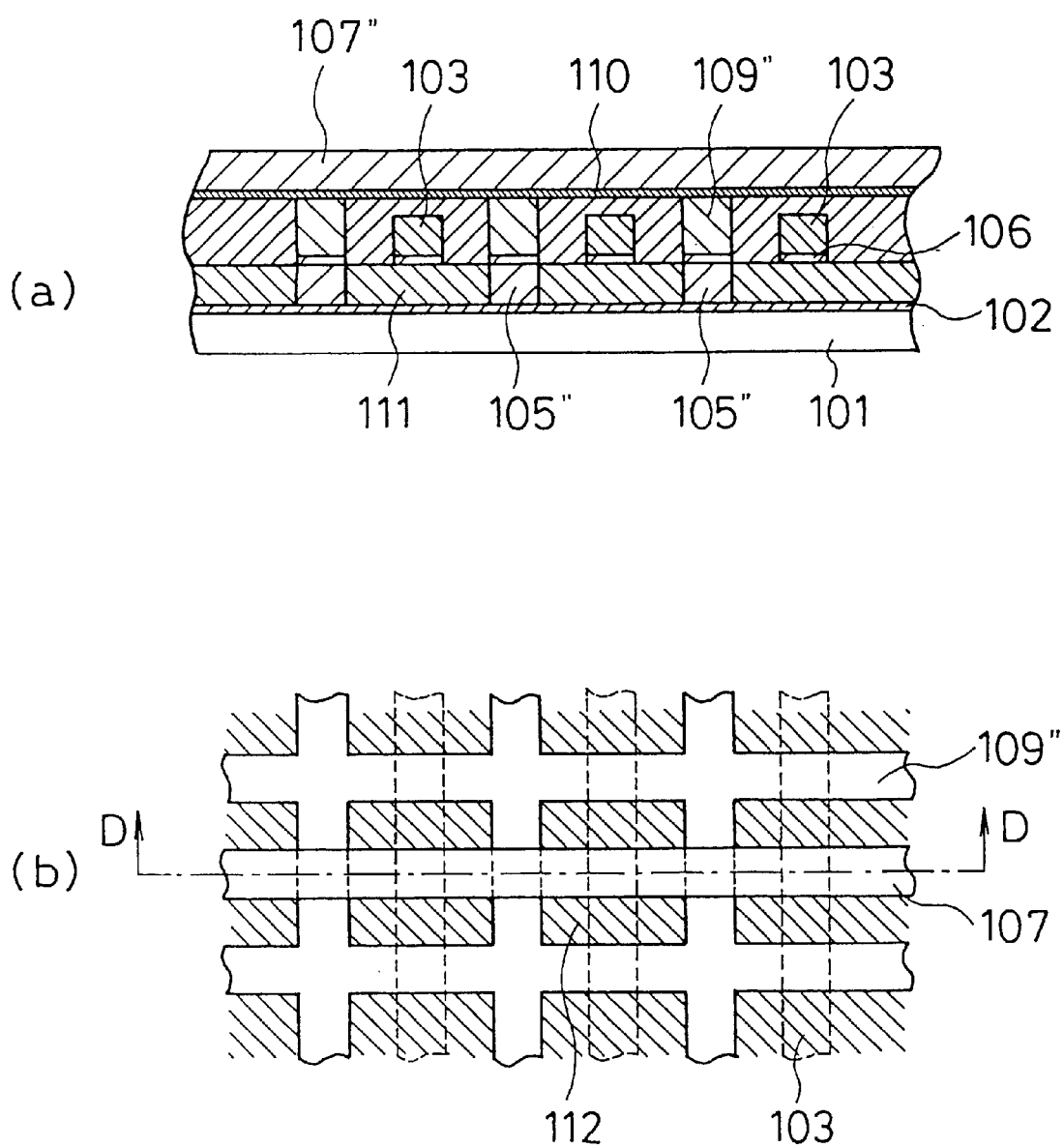

PRIOR ART Fig. 18
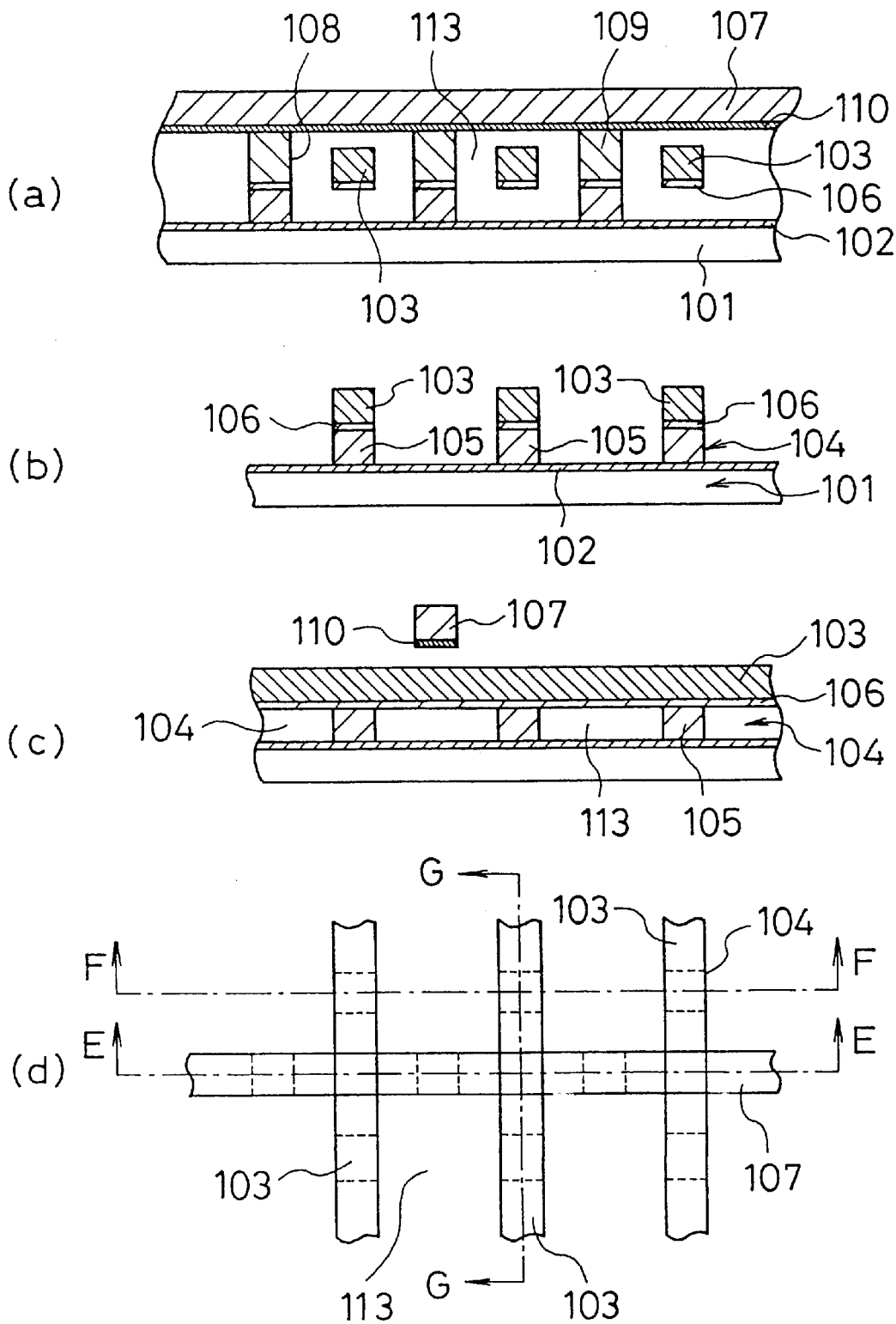

PRIOR ART Fig. 19
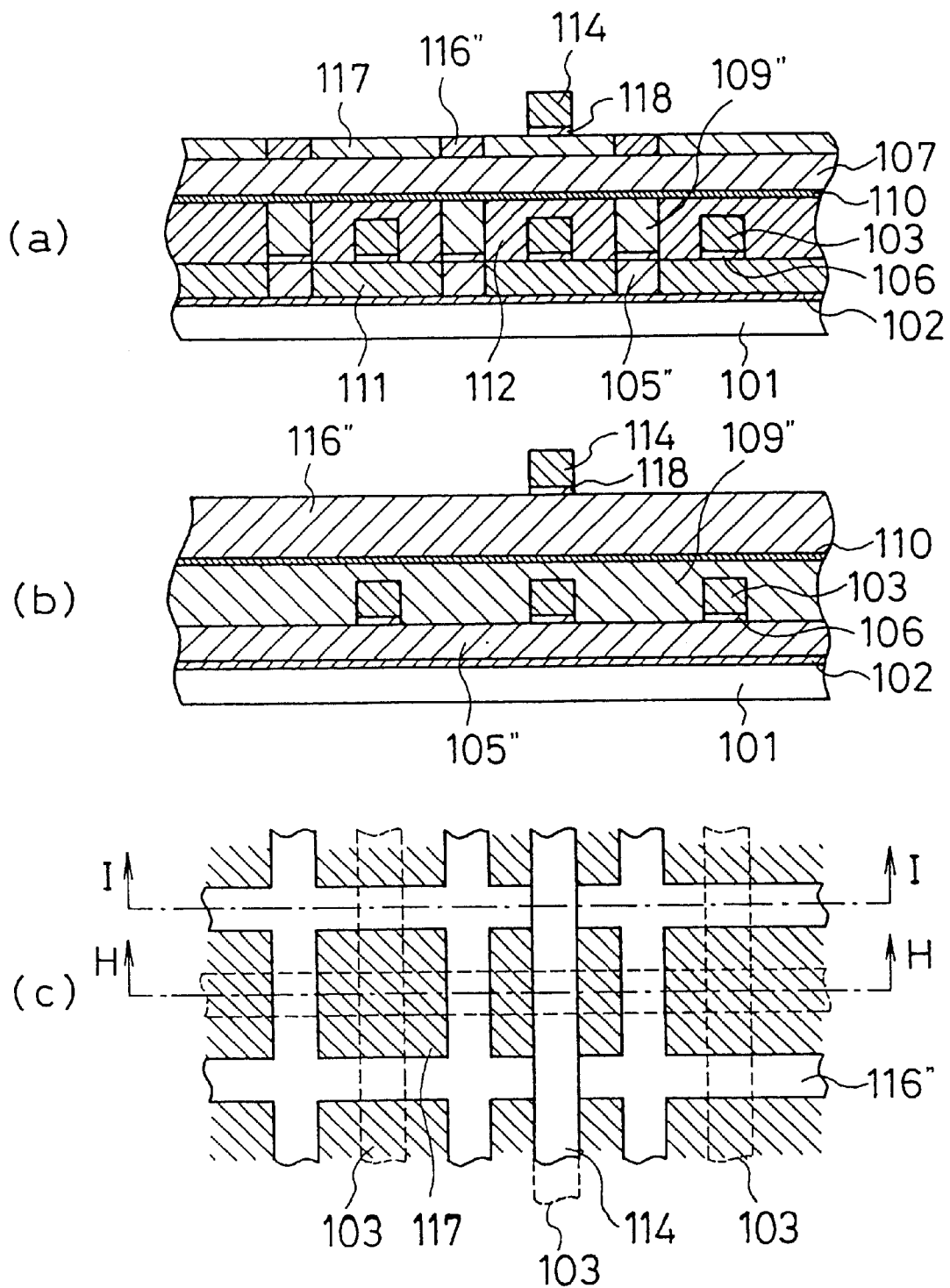

METHOD OF FORMING A WIRING LAYER HAVING AN AIR BRIDGE CONSTRUCTION

BACKGROUND OF THE INVENTION

1. Field of the Invention

The present invention relates to a semiconductor device and a method for manufacturing a semiconductor device, and more particularly to a semiconductor device that has an air bridge structure, and a method for manufacturing such as semiconductor device.

2. Description of the Related Art

In semiconductor devices, it is important to reduce the as parasitic capacitances between wires. Capacitance between neighboring wires or between upper and lower wires is a cause of a reduction in circuit speed.

In order to reduce parasitic capacitance, the usual method used is that of employing an insulating material having a low dielectric constant as an interlayer insulation film. However, the dielectric constant of an inorganic material that can withstand temperatures of approximately 400° C. is no lower than approximately 3, and with organic materials although there are materials with a dielectric constant of approximately 2, these materials, not being heat resistant, are impractical. For this reason, an air bridge interconnect has been proposed, in which the interlayer insulation film is removed, leaving just the metal interconnect. In this construction, because there is air (having a dielectric constant of 1) between the metal interconnects, it is possible to reduce the parasitic capacitance to the very minimum value. However, if the interconnect becomes long in the floating condition, problems caused by deformation, such as interconnect peeling and shorts caused by interconnect sagging occur.

Because of the above-noted problems, there is disclosed in Japanese Patent No. 2705556 the prevention of deformation of interconnects, by providing supporting posts at a fixed interval beneath a floating metal interconnect.

The above-noted disclosure is described below, with reference made to drawings. FIG. 13 is a perspective view that shows in conceptual form the above-noted technology, this showing a semiconductor integrated circuit having a two-layer wiring structure. In this device, a silicon substrate 101 has a silicon nitride ($Si_3N_4$) film 102 as a protective layer and etching stopper, a first aluminum interconnect 103 extending in a prescribed direction on top of first post-shaped interlayer insulation film 104, which are formed by postshaped CVD oxide film 105 that are formed at a uniform pitch, these first post-shaped interlayer insulation film 104 forming an air bridge structure that maintains a prescribed distance with respect to the silicon nitride film 102. In this case, a silicon nitride film 106 is also formed below the first aluminum interconnects 103, as an etching stopper.

The second aluminum interconnects 107, which are formed on top of the first aluminum interconnects 103 extend in a direction that is perpendicular to the first aluminum interconnects 103 and, similar to the first aluminum interconnects 103, these second aluminum interconnects 107 are maintained at a prescribed distance with respect to the silicon nitride film 102 by second post-shaped interlayer insulation films 108, which have a film thickness that is greater than that of the first post-shaped interlayer insulation films 104 and which are formed at a uniform interval. In this case, the second post-shaped interlayer insulation films 108 are formed as laminates of the above-noted post-shaped CVD oxide film 105, a silicon nitride film 106, and a post-shaped CVD oxide film 109. In this case as well, a silicon nitride film 110 is provided under the second aluminum interconnects 107, as an etching stopper.

Therefore, according to the above-noted construction, the first aluminum interconnects 103 and second aluminum interconnects 107 make contact with no elements other than the post-shaped interlayer insulation films 104 and 108, the surrounding area being a void, so that there is no insulation film between the first aluminum interconnects 103 and the second aluminum interconnects 107, thereby greatly reducing the wiring capacitance therebetween.

The method of manufacturing the above-noted wiring structure is described below. First, as shown in FIG. 14(*a*), a silicon nitride film 102 and a CVD oxide film 105' are formed on a silicon substrate 101. Then, as shown in FIG. 14(*b*), photolithography technology and oxide film etching technology are used to pattern the CVD oxide film 105' over the entire chip in a matrix pattern that is skewed by half pitch with the first aluminum interconnects 103 that are to be formed later, thereby forming a matrix CVD oxide film 105". Then, a silica film 111 is formed over the entire wafer, the resulting plan-view structure being shown in FIG. 14(*c*). FIG. 14(*b*) is a cross-section view along the line A—A that is shown in FIG. 14(*c*). In order to form the matrix CVD oxide film 105" over the entire semiconductor device at a uniform pitch, the silica film 111 is formed uniformly flatly over the entire surface. In this case, it possible to use an applied film such as a polyimide organic film instead of the silica film.

Next, as shown in FIG. 15(*a*), the applied silica film 111 is baked to cure the film, the resulting flat applied silica film 111 being etched over its entire surface to expose the surface of the matrix CVD oxide film 105", after which a silicon nitride film 106 and a first aluminum interconnect layer 103 are formed over the entire surface. At this point, although not shown in the drawing, in the case in which a contact is formed for the purpose of connection between the silicon substrate 101 and the first aluminum interconnects 103, after growing the silicon nitride film 106, before forming the first aluminum interconnect layer 103', photolithography technology and etching technology are used to form a contact hole in the silicon nitride film 106 and matrix CVD oxide film 105" and applied silica film 111 and silicon nitride film 102. The contact is formed by the growth of the first aluminum interconnect layer 103' and the filling of a via hole by tungsten or the like.

Then, as shown in FIG. 15(*b*), the first aluminum interconnect layer 103' is patterned using photolithography and aluminum etching technologies, thereby forming the first aluminum interconnects 103. FIG. 15(*c*) is the construction shown in plan view, and FIG. 15(*b*) is a cross-section view along the line B—B that is shown therein. It can be seen from the above that the first aluminum interconnects 103 are arranged in a vertical direction as shown in the drawings, and extend over the entire surface of the semiconductor device at a uniform pitch, and there is a half-pitch skew with respect to the matrix CVD oxide film 105".

Next, as shown by the broken lines in FIG. 16(*a*), a CVD oxide film 109' is grown on the exposed surface of the first aluminum interconnects 103 and silicon nitride film 106, this having a thickness that is greater than that of the first aluminum interconnects 103. Then, using the mask that was used to form the matrix CVD oxide film 105", photolithography and etching technologies are used to form the second matrix CVD oxide film 109", which is on-line overlapped with the matrix CVD oxide film 105". Additionally, the silicon nitride film 106 other than the lower part of the first aluminum interconnects 103 and the second matrix CVD oxide film 109" is etched, after which an applied silica film 112 is formed and the surface is flattened.

Next, as shown in FIG. 16(b), the entire surface of the applied silica film 112 is etched from above, so as to flatten the second matrix CVD oxide film 109". Over this entire surface, a silicon nitride film 110 is formed. FIG. 16(c) is a plan view of the above-noted condition, and FIG. 16(b) is a cross-section view along the direction of line C—C thereof. In the case in which via hole is to be formed for the purpose of connecting the first aluminum interconnects 103 and the second aluminum interconnects 107, similar to the case of the contact formation, a hole is formed in the applied silica film 112 and the silicon nitride film 110.

Next, as shown in FIG. 17(a), a second aluminum interconnect layer 107' is grown over the entire surface and photolithography and aluminum etching technologies are used to performing patterning of the second aluminum interconnects 107 and applied silica film 110 in a direction that is perpendicular to the wiring direction of the first aluminum interconnects 103, at the same pitch as the first aluminum interconnects 103, and skewed a half pitch with respect to the above-noted second matrix CVD oxide film 109". The condition after performing this patterning is shown in plan view in FIG. 17(b).

Then, as shown in the cross-section views of FIGS. 18 (a), (b), and (c), along the directions of lines E—E, F—F, and G—G, respectively, anisotropic etching is done from the top of the second aluminum interconnects 107, the second matrix CVD oxide film 109" and the applied silica film 112 except below the second aluminum interconnects 107 being etched until the first aluminum interconnects 103 are exposed. Additionally, when etching proceeds further the first aluminum interconnects 103 are exposed, after which etching is done of the matrix CVD oxide film 105" and the applied silica film 110 until the silicon nitride film 102 on the silicon substrate 101 is exposed, using the second aluminum interconnects 107 and the matrix CVD oxide film 105" as a mask. By doing this, the second post-shaped interlayer insulation film 108 below the second aluminum interconnects 107, which is on-line aligned with the silicon nitride film 110, the second post-shaped matrix CVD oxide film 109, the silicon nitride film 106, and the post-shaped CVD oxide film 105 is formed with a uniform pitch on the silicon nitride film 102 on the silicon substrate 101.

In a region in which this second post-shaped interlayer insulation film 108 does not exist, there exists the applied silica films 112 and 111 and a first aluminum interconnects 103, which is surrounded by the applied silica films 112 and 111. In a region in which only the first aluminum interconnect 103 exists, a post-shaped CVD oxide film 105 is formed with a uniform pitch on a silicon nitride film 102 on the silicon substrate 101, along with an applied silica film 111 that is surrounded by this post. Additionally, by performing wet etching using fluorine or the like for a short period of time only the applied silica films 111 and 112, which have a very fast etching rate compared to a CVD oxide film, are etched.

As a result, the applied silica films 111 and 112 parts become the hollows 113, thereby forming a first aluminum interconnect 103 having an air bridge structure that is supported by the first post-shaped insulation film 104, and a second aluminum interconnect 107 having an air bridge structure that is supported by the second post-shaped insulation film 108.

Therefore, the first aluminum interconnect 103 and the second aluminum interconnect 107 are supported independently by the post-shaped insulation films 104 and 108, which have different heights above the silicon nitride film 102 on the silicon substrate 101, and in an interconnect that has the minimum width, there is only a space between the first aluminum interconnect 103 and the second aluminum interconnect 107, enabling a great reduction in the wiring capacitance.

Because the above-noted technology enables the provision of insulating posts regardless of the positional relationship between upper wiring and lower wiring (the region in which wiring crosses or region in which wiring is isolated), it achieves a given effect with respect to wiring.

This method, however, in addition to the usual process steps for forming wiring, requires lithography and the like for formation of the insulation posts, this representing the problem of added process steps and an increased number of masks.

Accordingly, it is an object of the present invention to improve on the above-noted drawbacks of the prior art by particularly providing a novel semiconductor device in which air bridged wiring can be formed that has insulation posts, without an increase in the number of process steps or an increase in the number of masks, and a method of manufacturing the above-noted semiconductor device.

SUMMARY OF THE INVENTION

In order to achieve the above-noted object, the present invention adopts the following basic technical constitution.

Specifically, a first aspect of a semiconductor device according to the present invention is a semiconductor device that is provided with a via hole that connects an upper layer and a lower layer metal interconnect and which has wiring of an air bridge construction, wherein an insulation post supporting said upper layer metal interconnect is formed by a first insulation film that forms the outside part of said insulation post and a second insulation film that is surrounded by said first insulation film.

In a second aspect of the present invention, said insulation post has a diameter that is larger than the diameter of said via hole.

A first aspect of a method for manufacturing a semiconductor device according to the present invention is a method of manufacturing a semiconductor device having a wiring layer with an air bridge construction, this method comprising; a first step of forming a lower layer metal interconnect, a second step of depositing over the entire surface a first interlayer insulation film and making said surface flattened and then depositing a first insulation film, followed by depositing a second insulation film, third step of patterning said second insulation film and of etching said first insulation film and said first interlayer insulation film using said second insulation film as a mask so as to form a post opening part and of forming a via hole connecting a upper layer metal interconnect with said lower layer metal interconnect, a fourth step of depositing a third interlayer insulation film over the entire surface, including said post opening part and via hole, and then of performing etching back so as to leave said third insulation film in a side wall of said post opening part and fill said through hole with said third insulation film, a fifth step of depositing a fourth insulation film over the entire surface, then removing said fourth insulation film until said via hole being exposed, and then removing said third insulation film inside said via hole, a sixth step of filling said via hole with a metal for use in connection, and then flattening the entire surface, a seventh step of forming a metal film over said entire surface and further forming a fifth insulation film thereon, which is then patterned, an eighth step of etching said metal film using said patterned fifth insulation film so as to form said upper layer metal interconnect, and a ninth step of removing said first interlayer insulation film so as to form an air bridge interconnect.

In a second aspect of a method of manufacturing a semiconductor device according to the present invention, said post opening part has a diameter that is larger than the diameter of said via hole.

In a third aspect of a method of manufacturing a semiconductor device according to the present invention, the relationship between the diameter d1 of said post opening part formed in said third step and the film thickness T of said third insulation film that is deposited in said fourth step is d1>2T, and the relationship between the diameter d2 of said via hole and the film thickness T of said third insulation film is d2≦2T.

A feature of the present invention is that the insulation post is formed simultaneously with the formation of the via hole for the air bridge wire.

FIG. 5(c) shows the construction of a semiconductor device according to the present invention, in which the via hole and the insulation post are formed on the same layer. The method of manufacture is shown in FIG. 1 through FIG. 5, this being implemented by opening up the region in which the insulation post is to be formed so that it is larger than the via hole, and selectively filling with insulation material only the opening part that is to become the insulation post in the process step that forms the via hole opening.

According to the present invention, because there is no need for lithography to form the insulation post, a special mask for that purpose is not required.

Therefore, it is possible to achieve the effect of enabling manufacturing of an air bridge wiring structure in which deformation problems such as wiring droop do not occur, this being done with a small number of process steps and at a low cost.

BRIEF DESCRIPTION OF THE DRAWINGS

FIG. 13 is a drawing that illustrates the prior art.

FIG. 14 is a drawing that illustrates the manufacturing process steps in the prior art.

FIG. 15 is a drawing that illustrates the manufacturing process steps subsequent to those shown in FIG. 14.

FIG. 16 is a drawing that illustrates the manufacturing process steps subsequent to those shown in FIG. 15.

FIG. 17 is a drawing that illustrates the manufacturing process steps subsequent to those shown in FIG. 16.

FIG. 18 is a drawing that illustrates the manufacturing process steps subsequent to those shown in FIG. 17.

FIG. 19 is a drawing that illustrates the manufacturing process steps subsequent to those shown in FIG. 18.

DESCRIPTION OF THE PREFERRED EMBODIMENTS

Figure 1:
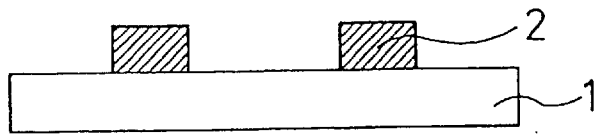
FIG. 1 is a drawing that illustrates the process steps of a method of manufacturing a semiconductor device according to the present invention.
Figure 1:
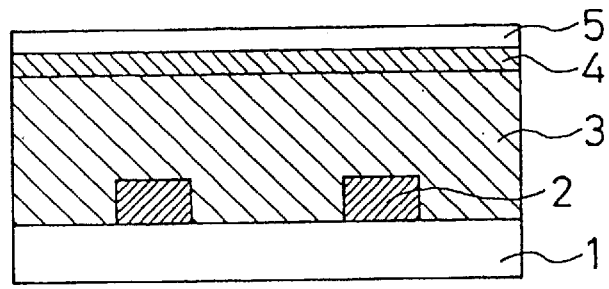
Figure 1:
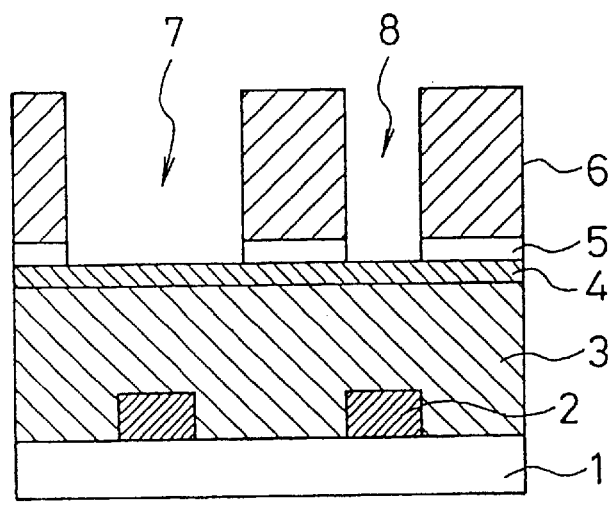
Figure 2:
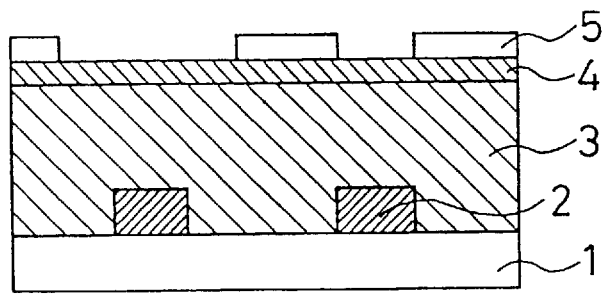
FIG. 2 is a drawing that illustrates the manufacturing process steps subsequent to those shown in FIG. 1.
Figure 2:
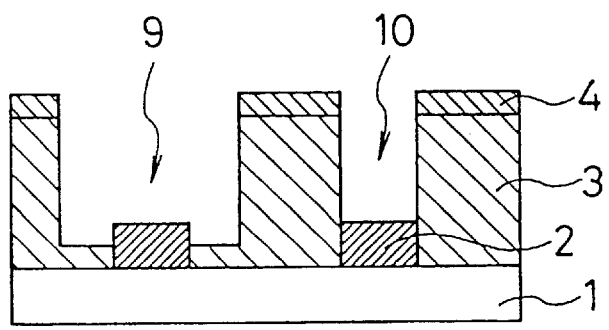
Figure 2:
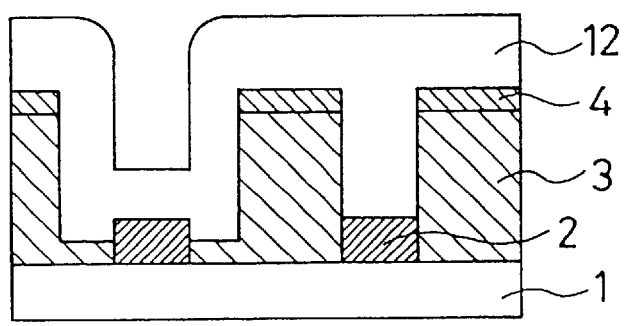
Figure 3:
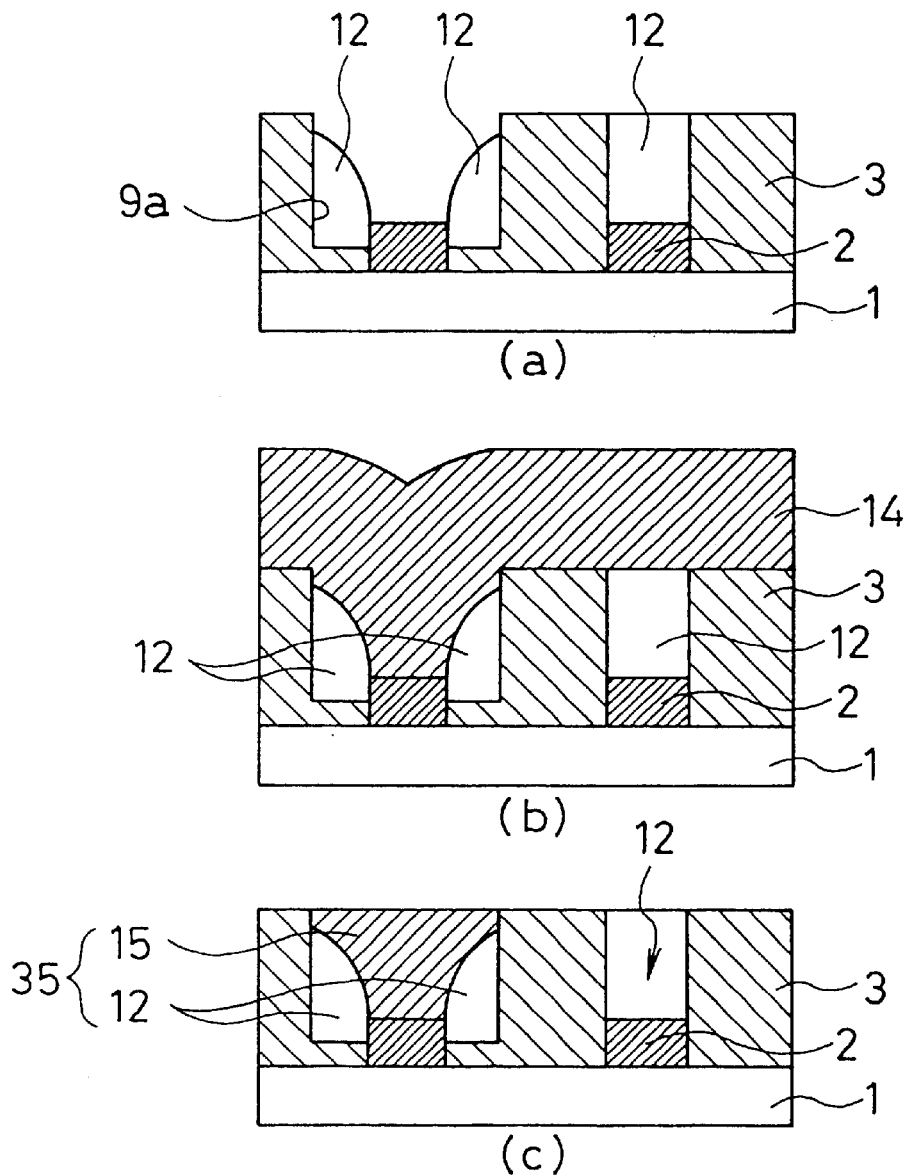
FIG. 3 is a drawing that illustrates the manufacturing process steps subsequent to those shown in FIG. 2.
Figure 4:
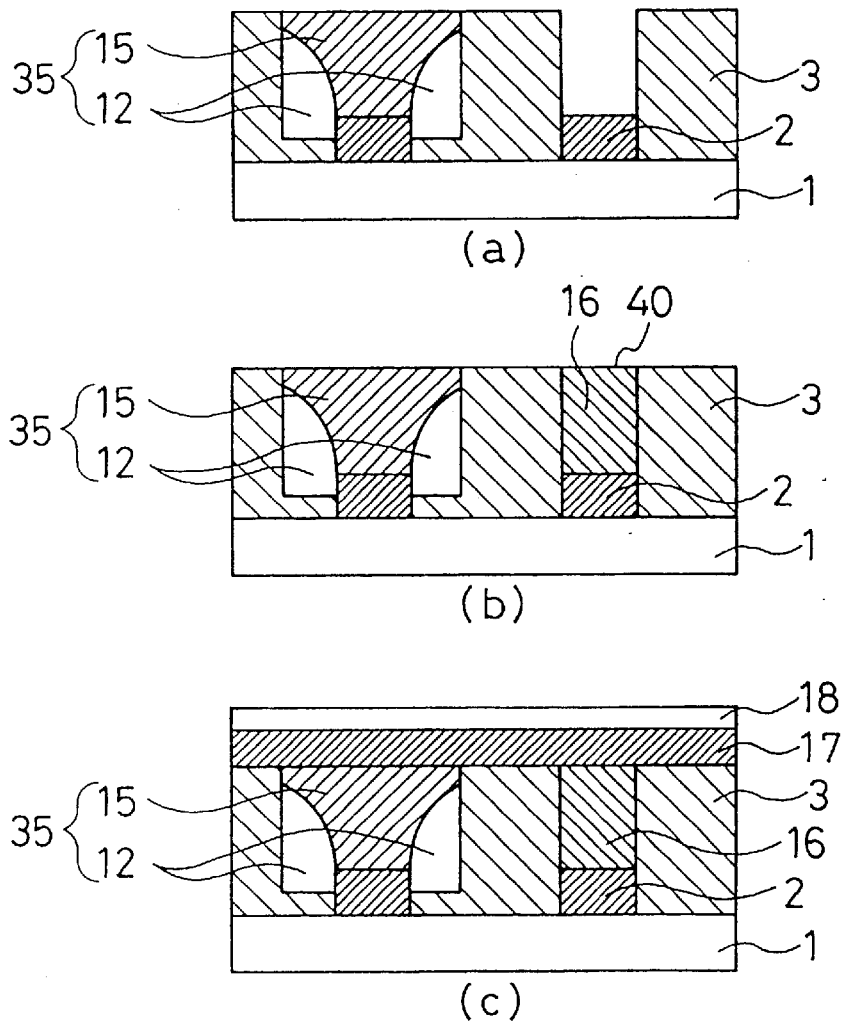
FIG. 4 is a drawing that illustrates the manufacturing process steps subsequent to those shown in FIG. 3.
Figure 5:
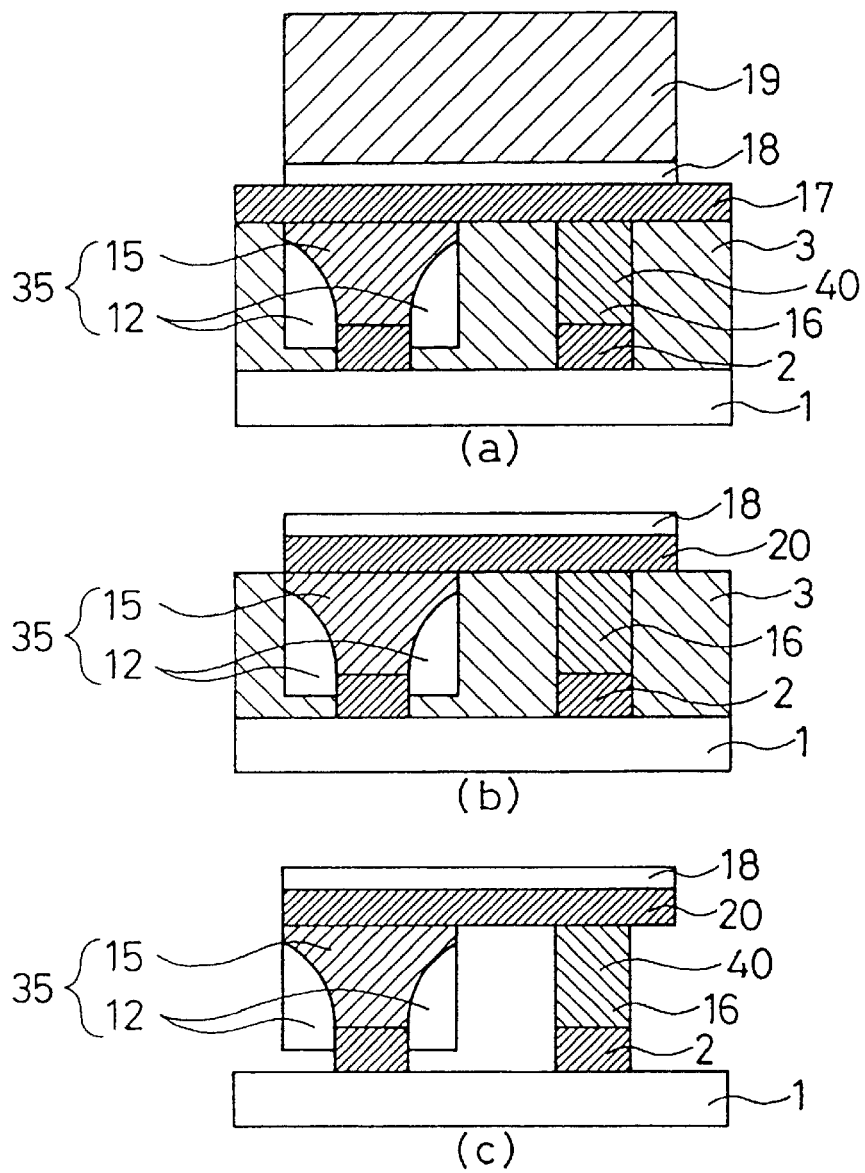
FIG. 5 is a drawing that illustrates the manufacturing process steps subsequent to those shown in FIG. 4.

Embodiments of a semiconductor device according to the present invention and a method of manufacturing a semiconductor device according to the present invention are described in detail below, with reference being made to relevant accompanying drawings.

FIG. 1 through FIG. 5 show the structure of an embodiment of a semiconductor device according to the present invention. These drawings show a semiconductor device in which an insulating post 35, which is provided for the purpose of supporting an upper metal interconnect 20 is formed by a first insulation film 12 that forms the outer part of the post and a second insulation film 15 that is surrounded by the first insulation film 12, a via hole 10 that is provided between the upper and lower metal interconnects 2 and 20 being filled with a metal 40 for the purpose of connecting these metal interconnects 2 and 20.

A method of manufacturing a semiconductor device according to the present invention is a method of manufacturing a semiconductor device that has a wiring layer with an air bridge structure, this manufacturing method comprising; a first step of forming a lower metal interconnect 2, a second step of depositing over the entire surface a first interlayer insulation film 3 to achieve flatness and then depositing a first insulation film 4, followed by depositing a second insulation film 5, a third step of patterning the above-noted second insulation film 5 and of etching a first insulation film 4 and the first interlayer insulation film 3 using this second insulation film 5 as a mask so as to form a post opening part 9 for the purpose of supporting an upper metal interconnect and also to form a via hole 10 for the purpose of connecting the upper metal interconnect with a lower metal interconnect 2, a fourth step of depositing a third interlayer insulation film 13 over the entire surface, including the above-noted post opening part 9 and via hole 10, and then performing etching so as to leave the third insulation film 12 in a side wall 9a of the post opening part 9 and fill the via hole 10 with this third insulation film 12, a fifth step of depositing a fourth insulation film 14 over the entire surface, then removing the fourth insulation film 14 until the via hole opening part 10 is exposed, and then removing the third insulation film 12 inside the via hole 10, a sixth step of filling the via hole 10 with a metal 40 for use in connection, and then flattening the entire surface, a seventh step of forming a metal film 17 over the entire surface and further forming a fifth insulation film 18 thereon, which is then patterned, an eighth step of etching the above-noted metal film 17 using the patterned fifth insulation film 18 so as to form the upper metal interconnect 20, and a ninth step of removing the first interlayer insulation film 3 so as to form an air bridge interconnect.

The present invention is described in further detail below.

Figure 11:
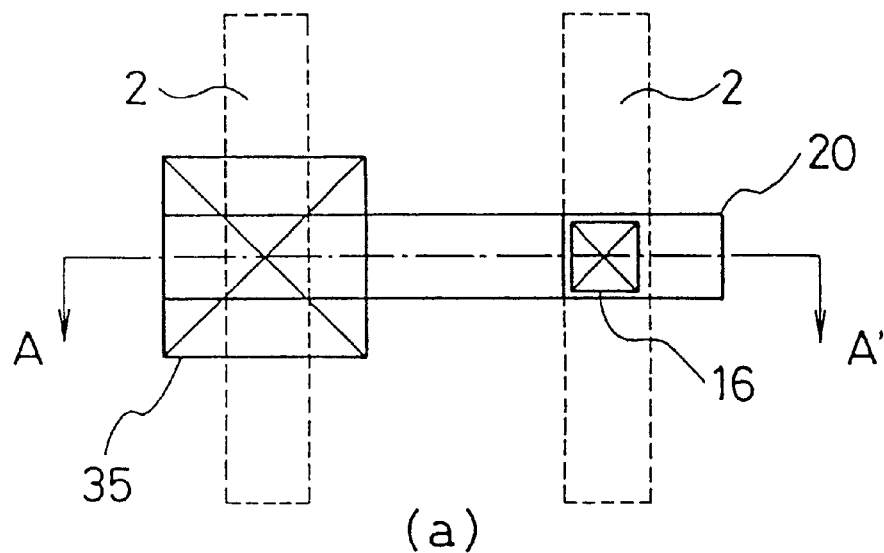
FIG. 11(a) is a drawing that shows the plan-view positional relationship in the present invention.
FIG. 11(b) is a drawing that shows the plan-view positional relationship in another embodiment of the present invention.
Figure 11:
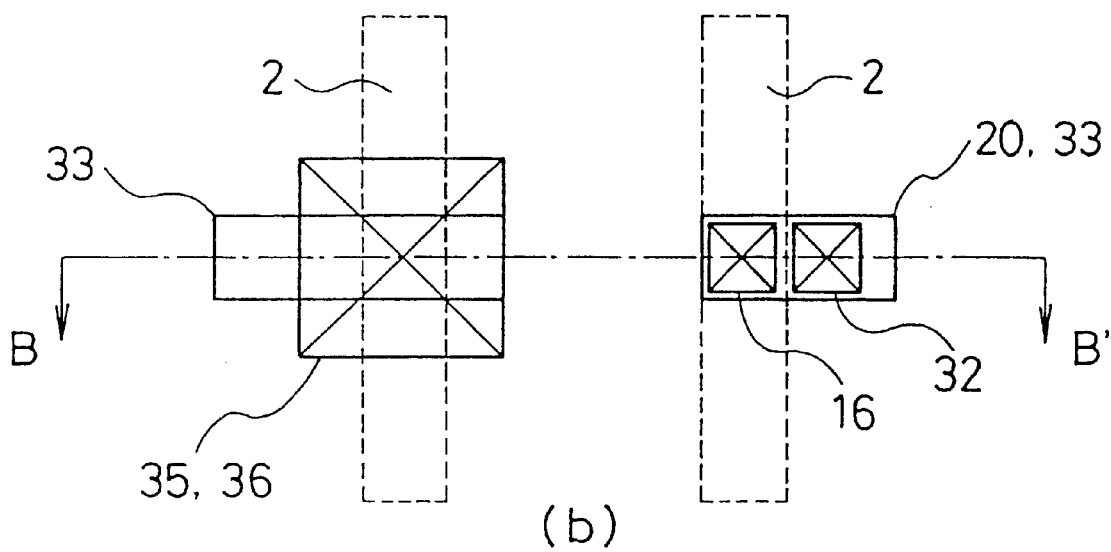

FIG. 11(a) is a plan view that shows the configuration of the present invention. FIG. 1 through FIG. 5 are cross-section views of the manufacturing process along the direction of line A—A' of this drawing.

As shown in FIG. 1(a), on a silicon substrate 1, onto which are formed a semiconductor element, a flat interlayer insulation film, and a contact plug (these elements not illustrated), the usual photolithography and etching technologies are used to form a first metal interconnect 2, that is made of aluminum or the like.

Next, as shown in FIG. 1(b), a flat first interlayer insulation film 3 is formed, after which the CVD method is used for form a first silicon nitride film 4 and a first silicon oxide film 5. An amorphous carbon film which contains fluorine, for example, is used as a first interlayer insulation film 3, and the CVD method is used to form this film, and the CMP method is used to flatten it. Because it is easy to remove such an organic film by exposing it to an oxygen plasma, it is suitable for use in an air bridge wiring structure. It should be noted, however, that the present invention is not restricted to the use of such an organic material, although the present invention is described for the case of using an organic.

Next, as shown in FIG. 1(c), lithography technology is used to pattern a first resist film 6, this film being used as a mask to etch away just the first silicon oxide film 5, thereby forming a post part 7 and a via hole 8. At this stage, the reason that the first silicon nitride film 4 is not etched is so that, with the organic first interlayer insulation film 3 exposed, it is not possible to perform oxygen plasma processing so as to remove the first resist film 6.

Next, as shown in FIG. 2(a), the first resist film 6 is peeled away.

Next, as shown in FIG. 2(b), using the first silicon oxide film 5 as a mask material, the first silicon nitride 4 and first interlayer insulation film 3 are etched, thereby forming the support opening part 9 and the via hole opening part 10. The drawing shows the condition in which overetching has caused the first silicon oxide film 5 to be removed, although even if it remains at this stage it can be removed at a subsequent process step (for example, at a CMP step for the silicon nitride film, to be described later).

Figure 12:
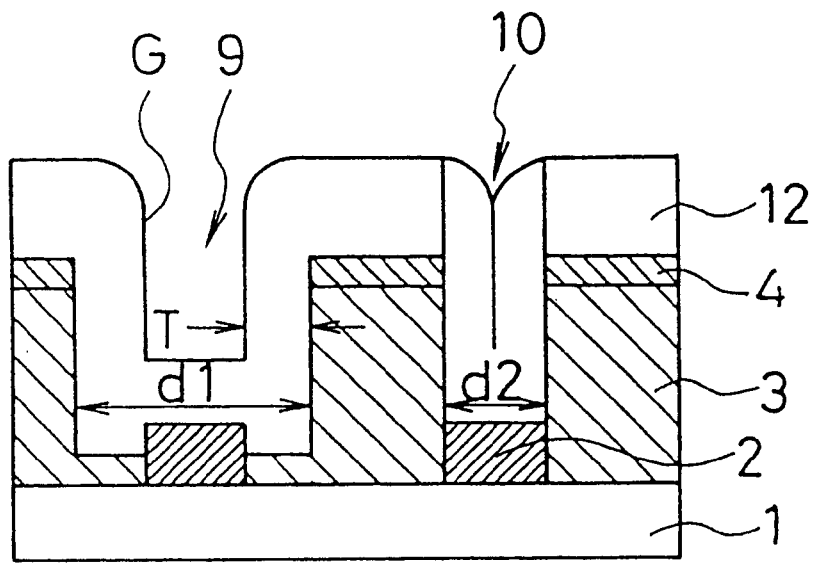
FIG. 12 is a drawing that shows the relationship between the post opening part and the diameter of the via hole part and the film thickness of the second silicon oxide film.

Next, as shown in FIG. 2(c), the CVD method is used to form a second silicon oxide film 12 over the entire surface. As shown in FIG. 12, the width d1 of the post opening part 9 and the width d2 of the via hole opening part 10 are pre-established so that their relationships to the thickness T of the opening part of the second silicon oxide film 12 are as follows.

d1>2T d2≦2T

Therefore, the post opening part 9 is not completely filled by the second silicon oxide film 12, a gap G being formed in the center part of the opening part 9.

Next, as shown in FIG. 3(a), anisotropic oxide film etching is done to etch back. When this is done, the via hole part is completely filled by the silicon oxide film 12, and the post has the silicon oxide film 12 remaining only at the wall. Then, silicon nitride film etching is done for a short period of time so as to remove the first silicon nitride film 4.

Next, as shown in FIG. 3(b), the CVD method is used to form a second silicon nitride film 14 over the entire surface.

Next, as shown in FIG. 3(c), the CMP method or etchback is used to leave the silicon nitride film 15 only within the post part, thereby forming the insulation post 35.

Next, as shown in FIG. 4(a), oxide film etching is done to remove the silicon oxide film 12 from the via hole part 10. When this is done, the etching conditions are set so that there is not much etching of the silicon nitride film 15 and the first interlayer insulation film 3.

Next, as shown in FIG. 4(b), the via hole part 10 is filled with tungsten 40, so as to form the first via hole 16. This is implemented by growing tungsten over the entire surface and then using etchback or CMP. The entire surface is then flattened.

Next, as shown in FIG. 4(c), sputtering is used to form a second metal film 17 of aluminum or the like over the entire surface. Then, a third silicon oxide film 18 is formed using the CVD method.

Next, as shown in FIG. 5(a), lithography of oxide film etching using a second resist film 19 is done to etch the third silicon oxide film 18. The reason that the metal film is not etched at this stage is that, with the organic first interlayer insulation film 3 exposed, it is not possible to perform oxygen plasma processing so as to remove the second resist film 19.

Next, as shown in FIG. 5(b), after peeling away the resist film, the second metal film 17 is etched, using the third silicon oxide film 18 as a mask material, thereby forming the second metal interconnect 20.

Next, as shown in FIG. 5(c), oxygen plasma processing is done to remove the first interlayer insulation film 3 from between interconnects, leaving the metal interconnect, the via hole 16, and the insulation post 35, thereby completing the fabrication of the air bridge wiring.

In this embodiment, although a silicon oxide film and a silicon nitride film are used as materials for the insulation post, the present invention is not restricted in this manner, and it is possible to use any material that enables use of the above-noted selective etching.

In the method according to this embodiment, because there is a step of selectively filling an opening for the post with an insulation material, there is the advantage of being able to form the via hole and insulation post in one step of lithography.

While the above-described embodiment was for the case in which the present invention is applied to a two-layer interconnect structure, it is also possible to apply the present invention to an interconnect structure having more than this number of layers. In the above-noted example, the case described was that of insulation posts formed between upper and lower interconnect layers in a two-layer structure. It is also possible to have a case in which, in a multilayer interconnect structure, for example, it is necessary to have insulation posts between a first interconnect layer and a third interconnect layer. FIG. 11(b) shows this configuration in plan view. FIG. 6 through FIG. 10 are process cross-section views as seen from the direction of the line B—B' in FIG. 11(b).

Because the process steps up to just before the forming of the second interconnect are the same as described for the first embodiment, illustrated by FIG. 1 through FIG. 4, their description will not be repeated.

Therefore, as shown in FIG. 6(a), after the process step of FIG. 4(c), lithography or oxide film etching using the second resist film is done to etch the third silicon oxide film 18.

Next, as shown in FIG. 6(b), after peeling away the second resist film 19, using the third silicon oxide film 18 as a mask material the second metal film 17 is etched, thereby forming the second metal interconnect 20. This metal interconnect is not located over the insulation post 35.

Figure 6:
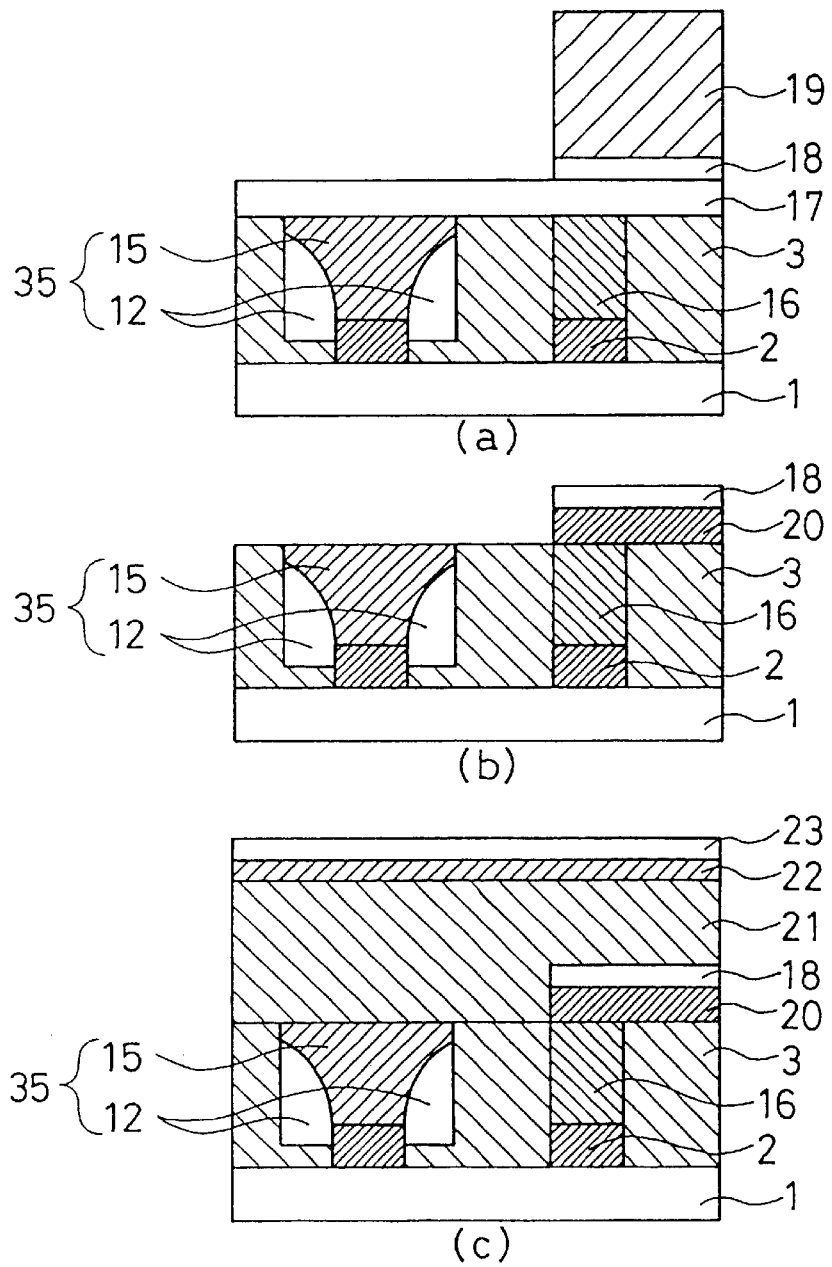
FIG. 6 is a drawing that illustrates the process steps of a method of manufacturing a semiconductor device according to another embodiment of the present invention.

Next, as shown in FIG. 6(*c*), a flat second interlayer insulation film 21 is formed from an amorphous carbon film that contains a fluorine additive, after which the CVD process is used to form a third silicon nitride film 22 and a fourth silicon oxide film 23.

Figure 7:
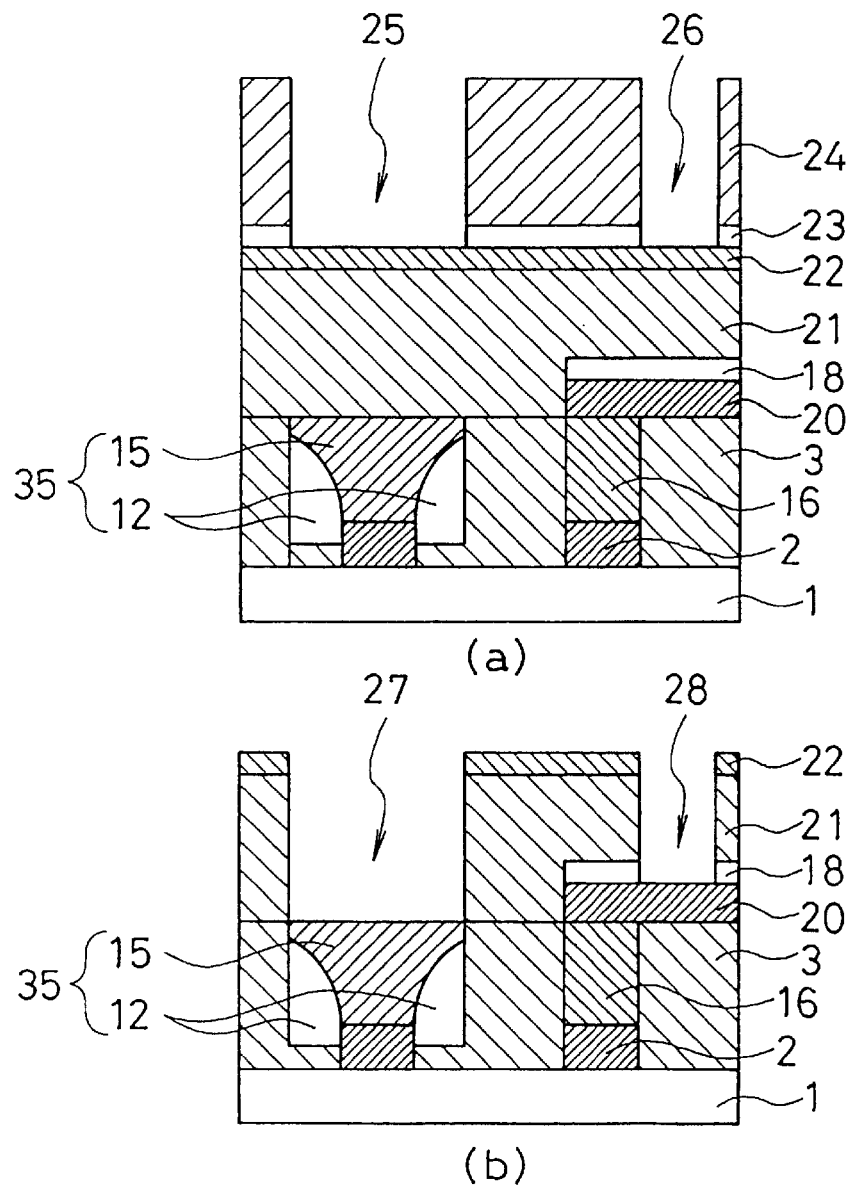
FIG. 7 is a drawing that illustrates the manufacturing process steps subsequent to those shown in FIG. 6.

Next, as shown in FIG. 7(*a*), a third resist film 24 is patterned using lithography, this being used as a mask material to etch the fourth silicon oxide film 23, thereby forming the insulation post 25 and the via hole 26.

Next, as shown in FIG. 7(*b*), using the fourth silicon oxide film 23 as a mask material, the second interlayer insulation film 21 and the third silicon oxide film 18 are etched, thereby forming the post opening part 27 and the via hole opening part 28. At the bottom part of the post opening part 27, the insulation post 35 is exposed.

Figure 8:
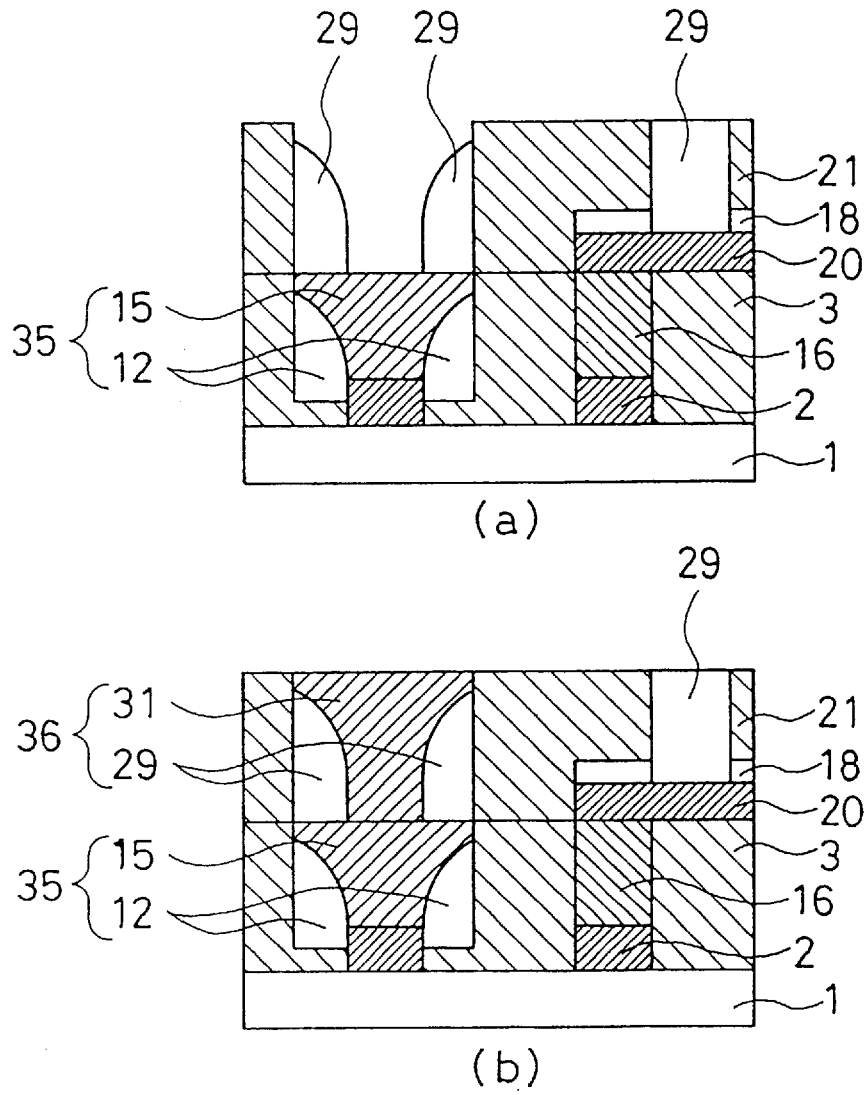
FIG. 8 is a drawing that illustrates the manufacturing process steps subsequent to those shown in FIG. 7.

Next, as shown in FIG. 8(*a*), silicon oxide film growth and anisotropic etching are used to completely fill the via hole with the silicon oxide film 29, and to leave the silicon oxide film 29 on only the side wall part of the post. Then, silicon nitride film etching is done for a short period of time so as to remove the first silicon nitride film 22.

Next, as shown in FIG. 8(*b*), after using CVD to form a silicon nitride film 31 over the entire surface, the CMP method is used to leave the silicon nitride film 31 on only the post part, thereby forming the insulation post 36 immediately above the in insulation post 35.

Figure 9:
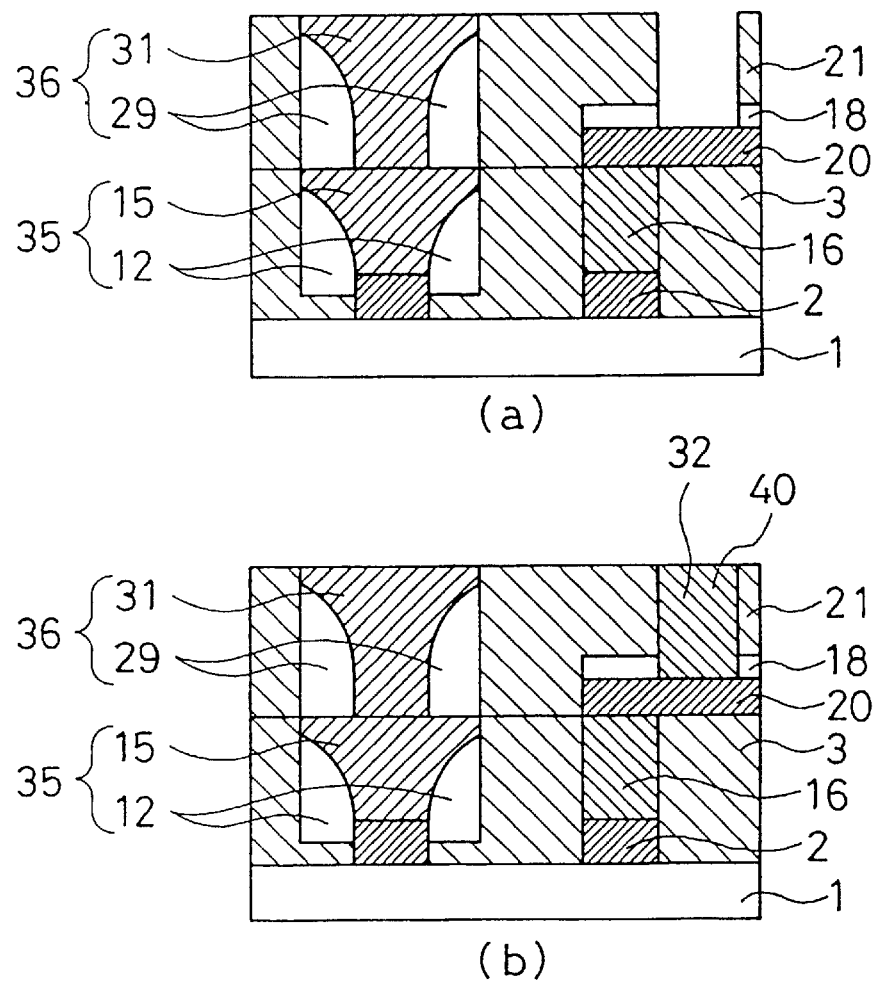
FIG. 9 is a drawing that illustrates the manufacturing process steps subsequent to those shown in FIG. 8.

Next, as shown in FIG. 9(*a*), oxide film etching is done to remove the silicon oxide film 29 of the via hole part.

Next, as shown in FIG. 9(*b*), the via hole is filled with the tungsten 40, thereby forming the second via hole 32.

Figure 10:
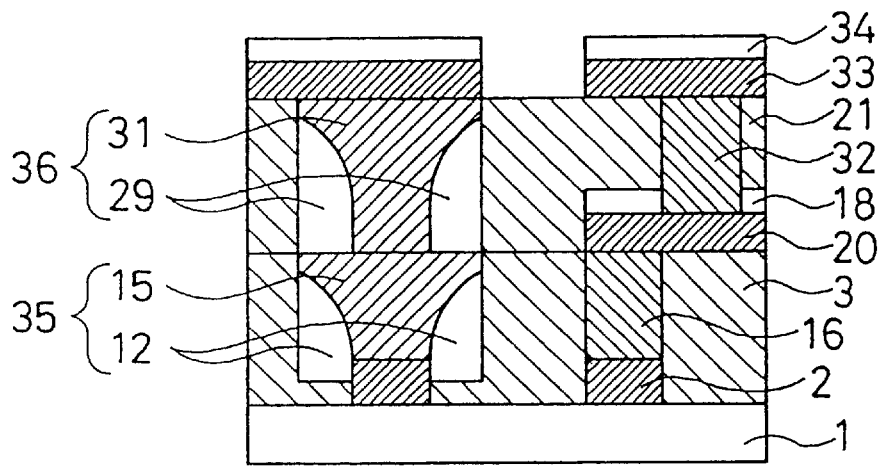
FIG. 10 is a drawing that illustrates the manufacturing process steps subsequent to those shown in FIG. 9.
Figure 10:
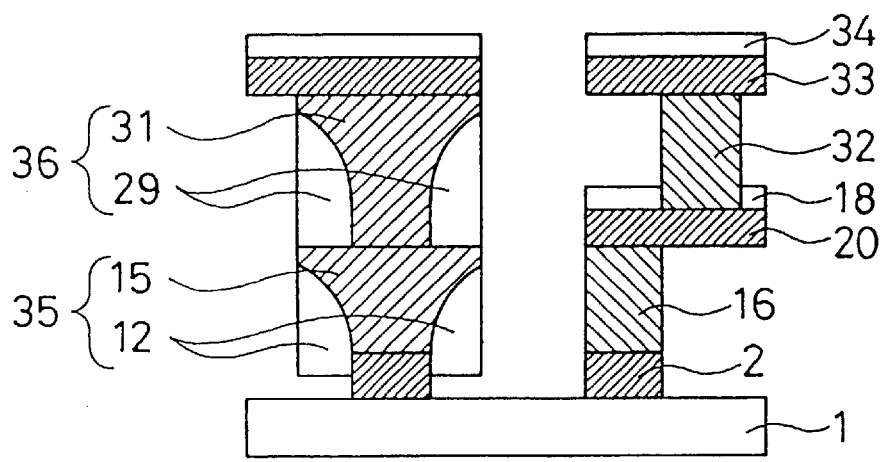

Next, as shown in FIG. 10(*a*), by the formation of a fifth silicon oxide film 34 and the metal film etching using this as a mask material, a third metal interconnect 33 is formed from aluminum or the like. The details of this are as described earlier.

Next, as shown in FIG. 10(*b*), oxygen plasma processing is used to remove the first interlayer insulation film 3 and second interlayer insulation film 21 between the interconnects, thereby leaving the metal interconnects, the via holes 16 and 32, and the insulation posts 35 and 26, this completing the air bridge interconnect structure.

Using the above-noted manufacturing method, therefore, it is possible to achieve the effect of positioning insulation posts without regard to the condition of the lower interconnect layer.

By adopting the above-described constitution, a method of manufacturing a semiconductor device according to the present invention enables the formation of an air bridge interconnect structure having insulation posts, without an increase in the number of process steps or number of masks.

What is claimed is:

1. A method of manufacturing a semiconductor device having a wiring layer with an air bridge construction, this method comprising;

a first step of forming a lower layer metal interconnect, a second step of depositing over the entire surface of the lower metal layer interconnect an interlayer insulation film and making a surface of the interlayer insulation film flattened and then depositing a first insulation film, followed by depositing a second insulation film, a third step of patterning said second insulation film and of etching said first insulation film and said interlayer insulation film using said second insulation film as a mask so as to form a post opening part and a via hole to connect an upper layer metal interconnect with said lower layer metal interconnect, a fourth step of depositing a third insulation film over the entire surface of the structure obtained from the third step, including said post opening part and via hole, and then of performing etching back so as to leave said third insulation film in a side wall of said post opening part and fill said via hole with said third insulation film, a fifth step of depositing a fourth insulation film over the entire surface of the structure obtained from the fourth step, then removing said fourth insulation film until said via hole being exposed, and then removing said third insulation film inside said via hole, a sixth step of filling said via hole with a metal, and then flattening the entire surface of the structure obtained, a seventh step of forming a metal film over said entire surface of the flattened structure obtained from the sixth step and further forming a fifth insulation film thereon, which is then patterned, an eighth step of removing said metal film using said patterned fifth insulation film as a mask so as to form said upper layer metal interconnect, and a ninth step of etching said interlayer insulation film so as to form an air bridge interconnect.

2. A method of manufacturing a semiconductor device according to claim 1, wherein said post opening part has a diameter that is larger than the diameter of said via hole.

3. A method of manufacturing a semiconductor device according to claim 1, wherein the relationship between the diameter d1 of said post opening part formed in said third step and the film thickness T of said third insulation film that is deposited in said fourth step is $d1>2T$, and the relationship between the diameter d2 of said via hole and the film thickness T of said third insulation film is $d2<2T$.

* * * * *